United States Patent
Ramsbey et al.

(10) Patent No.: US 6,645,801 B1
(45) Date of Patent: Nov. 11, 2003

(54) SALICIDED GATE FOR VIRTUAL GROUND ARRAYS

(75) Inventors: Mark T. Ramsbey, Sunnyvale, CA (US); Yu Sun, Saratoga, CA (US); Chi Chang, Redwood City, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/968,456

(22) Filed: Oct. 1, 2001

(51) Int. Cl.[7] .................. H01L 21/8234; H01L 21/336; H01L 21/3205; H01L 21/44; H01L 29/792
(52) U.S. Cl. ...................... 438/216; 438/261; 438/591; 438/593; 438/655; 438/258; 257/324; 257/321; 257/314; 257/315; 257/316; 257/317
(58) Field of Search ................................ 438/261, 216, 438/591, 593, 655, 258

(56) References Cited

U.S. PATENT DOCUMENTS

| | | | |
|---|---|---|---|
| 4,173,766 A | 11/1979 | Hayes | 357/23 |
| 5,168,334 A | 12/1992 | Mitchell et al. | 257/324 |
| 5,284,784 A | 2/1994 | Manley | 437/43 |
| 5,349,221 A | 9/1994 | Shimoji | 257/324 |
| 5,717,635 A | 2/1998 | Akatsu | 365/185.05 |
| 5,768,192 A | 6/1998 | Eitan | 365/185.24 |
| 5,966,603 A | 10/1999 | Eitan | 438/258 |
| 5,972,751 A | 10/1999 | Ramsbey et al. | 438/257 |
| 6,001,689 A | 12/1999 | Van Buskirk et al. | 438/266 |
| 6,023,085 A | 2/2000 | Fang | 257/315 |
| 6,030,871 A | 2/2000 | Eitan | 438/276 |
| 6,074,915 A | 6/2000 | Chen et al. | 438/258 |
| 6,130,453 A | 10/2000 | Mei et al. | 257/315 |
| 6,143,608 A | 11/2000 | He et al. | 438/264 |
| 6,153,467 A | 11/2000 | Wu | 438/257 |
| 6,153,471 A | 11/2000 | Lee et al. | 438/263 |
| 6,157,575 A | 12/2000 | Choi | 365/185.29 |
| 6,159,795 A | 12/2000 | Higashitani et al. | 438/257 |

OTHER PUBLICATIONS

"A True Single–Transistor Oxide–Nitride–Oxide EEPROM Device," T.Y. Chan, et al., IEEE Electron Device Letters, vol. EDL 8, No. 3, Mar. 1987.

"An Electrically Alterable Nonvolatile Memory Cell Using a Floating–Gate Structure," Daniel C. Guterman, et al., IEEE Transactions on Electron Devices, vol. ED–26, No. 4, Apr. 1979.

"NROM: A Novel Localized Trapping, 2–Bit Nonvolatile Memory Cell," Boaz Eitan, et al., IEEE Electron Device Letters, vol. 21, No. 11 Nov. 2000.

*Primary Examiner*—Steven Loke
*Assistant Examiner*—Samuel A Gebremariam
(74) *Attorney, Agent, or Firm*—Amin & Turocy, LLP (57) ABSTRACT

The present invention provides a process for saliciding the word lines in a virtual ground array flash memory device without saliciding the substrate between word lines. According to the invention, in a process for manufacturing virtual ground array flash memory devices, a salicide protect layer covers the substrate between word lines in the core region while the tops of the word lines are exposed. The salicide protect layer can be brought into the desired configuration by one or more of masking the substrate between word lines during an etching process, removing salicide protection material in the core by polishing, and forming a comparatively thick layer of salicide protection material in the core whereby the tendency of the salicide protect layer to follow the contour of the underlying structures is reduced. With the substrate between word lines protected by the salicide protect layer, the word lines are salicided. The process of the invention produces virtual ground array flash memory devices with salicided word lines, but without shorting between bit lines.

30 Claims, 10 Drawing Sheets

SALICIDED GATE FOR VIRTUAL GROUND ARRAYS

TECHNICAL FIELD

The present invention generally relates to fabricating nonvolatile semiconductor memory devices. In particular, the present invention relates to improved methods of fabricating flash memory devices with bit lines that can serve as sources and/or drains.

BACKGROUND

A desire for compact size and high access speed has driven the development of EEPROM (electrically erasable programmable read only memory) flash memory devices. One such development, applicable to both conventional and SONOS (silicon-oxide-nitride-oxide-silicon) flash memory devices, provides a virtual ground array structure. While a non-virtual ground array structure has dedicated source and drain regions for reading and writing operations, a virtual ground array structure reduces the spacing between gates by employing bit lines that can serve as either sources or drains according to the voltages applied.

Reducing the size of flash memory devices increases their speed, but speed can be enhanced in other ways. In a large array, speed is enhanced by reducing the spacing between contacts along bit lines. Contacts take up room and generally require a broader spacing between adjacent word lines wherever the contacts are to be placed. A compromise between the gains of more narrowly spaced contacts and the cost of having more contacts is to place contacts along the bit lines at every 16 word lines.

The response delay associated with polysilicon word lines can be reduced by siliciding, which provides lower electrical resistance. Siliciding is generally carried out without masking in what is referred to as a self-aligned siliciding process (saliciding). Unfortunately, saliciding has proven difficult in virtual ground arrays. The saliciding process has a tendency to cause shorting between bit lines, particularly in the absence of oxide island isolation regions.

In general, memory devices are faster and more compact than ever. However, there remains a demand for ever faster and/or more compact memory devices.

SUMMARY OF THE INVENTION

The following presents a simplified summary of the invention in order to provide a basic understanding of some of its aspects. This summary is not an extensive overview of the invention and is intended neither to identify key or critical elements of the invention nor to delineate its scope. The primary purpose of this summary is to present some concepts of the invention in a simplified form as a prelude to the more detailed description that is presented later.

The present invention provides a process for saliciding the word lines in a virtual ground array flash memory device without saliciding the substrate between word lines, which could cause shorting between bitlines. According to the invention, in a process for manufacturing virtual ground array flash memory devices, a salicide protect layer covers the substrate between word lines in the core region while the tops of the word lines are exposed. The salicide protect layer can be a spacer material, a dielectric material, or other material and can be formed solely to provide salicide protection, or as part of a routine step, such as providing spacers adjacent gates. The salicide protect layer can be brought into the desired configuration by one or more of masking the substrate between word lines during an etching process, removing salicide protection material in the core by polishing, and forming a comparatively thick layer of salicide protection material in the core whereby the tendency of the salicide protect layer to follow the contour of the underlying structures is reduced. With the substrate between word lines protected by the salicide protect layer, the word lines are salicided.

The process of the invention produces virtual ground array flash memory devices with salicided word lines, but without shorting between bit lines. Even where the word lines are broadly spaced to accommodate bit line contacts, the salicide protect layer covers the substrate, while the tops of the word lines are exposed. The salicide protect layer prevents the substrate between word lines from becoming salicided.

Other advantages and novel features of the invention will become apparent from the following detailed description of the invention and the accompanying drawings. The detailed description and drawings provide certain illustrative examples of the invention. These examples are indicative of but a few of the various ways in which the principles of the invention can be employed.

DISCLOSURE OF THE INVENTION

The present invention involves a process for fabricating virtual ground array flash memory devices, and in particular, a process for saliciding the word lines of such devices without saliciding the substrate between word lines. The devices have core and peripheral regions. The core region includes memory cells and the peripheral region includes low voltage gates, high voltage gates, and other input/output circuitry. The memory cells include polysilicon or amorphous silicon control gates that are connected in continuous strips to form word lines. The drains and the sources of the memory cells are connected, either in series or in parallel, to form bit lines. Using decoders and control circuitry in the peripheral region, each memory cell can be addressed for programming, reading or erasing functions. Saliciding of word lines reduces the electrical response delay in performing these functions.

Figure 1:
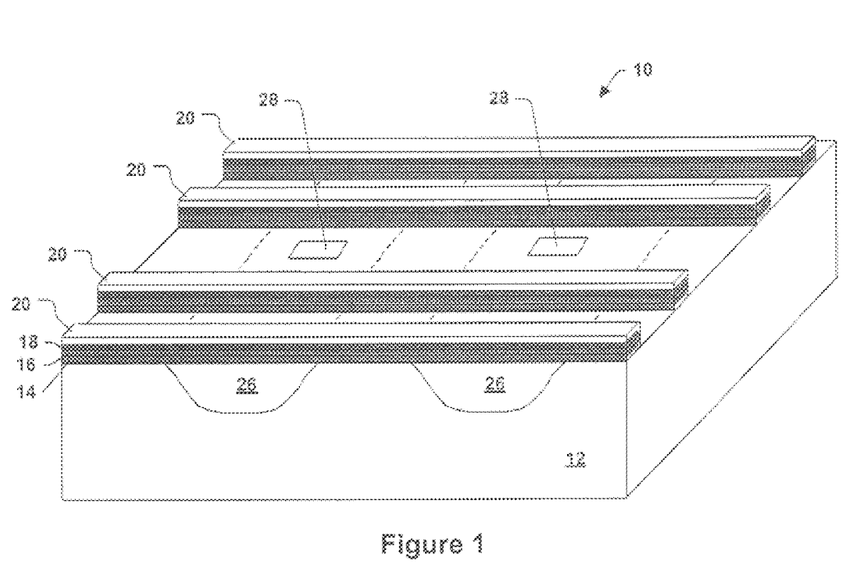
FIG. 1 illustrates an oblique view of a portion of a device according to one aspect of the present invention.
Figure 2:
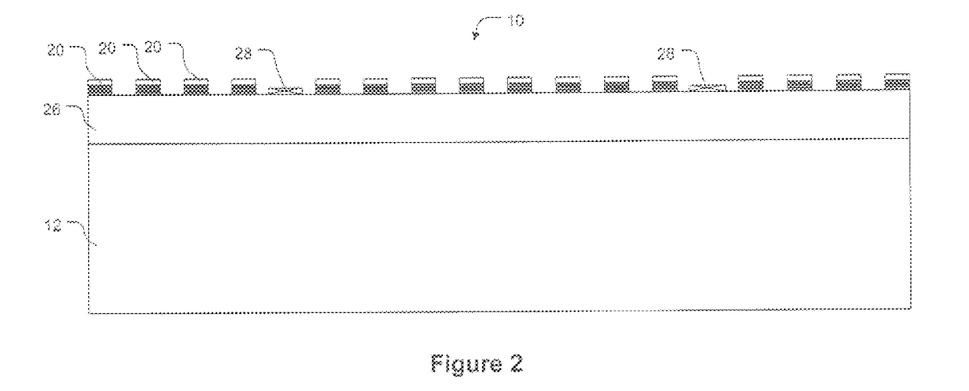
FIG. 2 illustrates a cross-sectional view of another portion of the device of FIG. 1.

The present invention is now described with reference to the figures, wherein like features are referred to with like numbers throughout. FIGS. 1 and 2 illustrate portions of the core region of a flash memory device 10 with salicided word lines according to one aspect of the present invention. The device illustrated has a NOR structure, has buried bit lines, and is of SONOS type. However the invention encompasses devices with NAND structure, bit lines that are not buried, and floating gate memory cells.

Word lines 20 of device 10 are continuous strips patterned from a polysilicon or amorphous silicon layer. Word lines 20 overlay dielectric charge trapping layers that include oxide layer 14, nitride layer 16, and oxide layer 18. Some of the word lines 20 are comparatively broadly spaced to provide room for bit line contacts 28. Bit line contacts 28 generally include a metal, aluminum or copper, for example. In FIG. 2, bit line contacts 28 are illustrated as occurring once every eight word lines, however, other periods can be employed. Memory cells occur along word lines 20 between buried bit lines 26. Buried bit lines 26 include doped regions of substrate 12 and serve as sources and drains for the memory cells. The bit lines are electrically isolated from each other by portions of substrate 12 with opposite doping from that of bit lines 26 (forming oppositely directed p-n junctions). Word lines 20 are salicided, but the substrate between word lines is essentially free of salicide.

The memory cells can be floating gate memory cells, although in such a case at least one of the charge trapping layers is conductive and does not form continuous strips along the word lines. The portions of substrate 12 between word lines 20 are generally free from oxide islands, although these portions of the substrate are often covered by a relatively thin layer of spacer material or other material used for salicide protection as described more fully below. Oxide islands are layers of dielectric material that are generally at least about 100 Å thick, and typically at least about 500 Å thick, such as formed by local oxidation of silicon (LOCOS) or shallow trench isolation (STI). Prior art memory devices commonly have oxide islands formed in spaces between word lines. These islands are provided at locations where they facilitate maintaining electrical isolation of bit lines. For example, oxide islands may be placed between bit lines to protect portions of the substrate that serve to electrically isolate adjacent bit lines. Oxide islands are generally unnecessary in devices made according to processes of the present invention.

Figure 3:
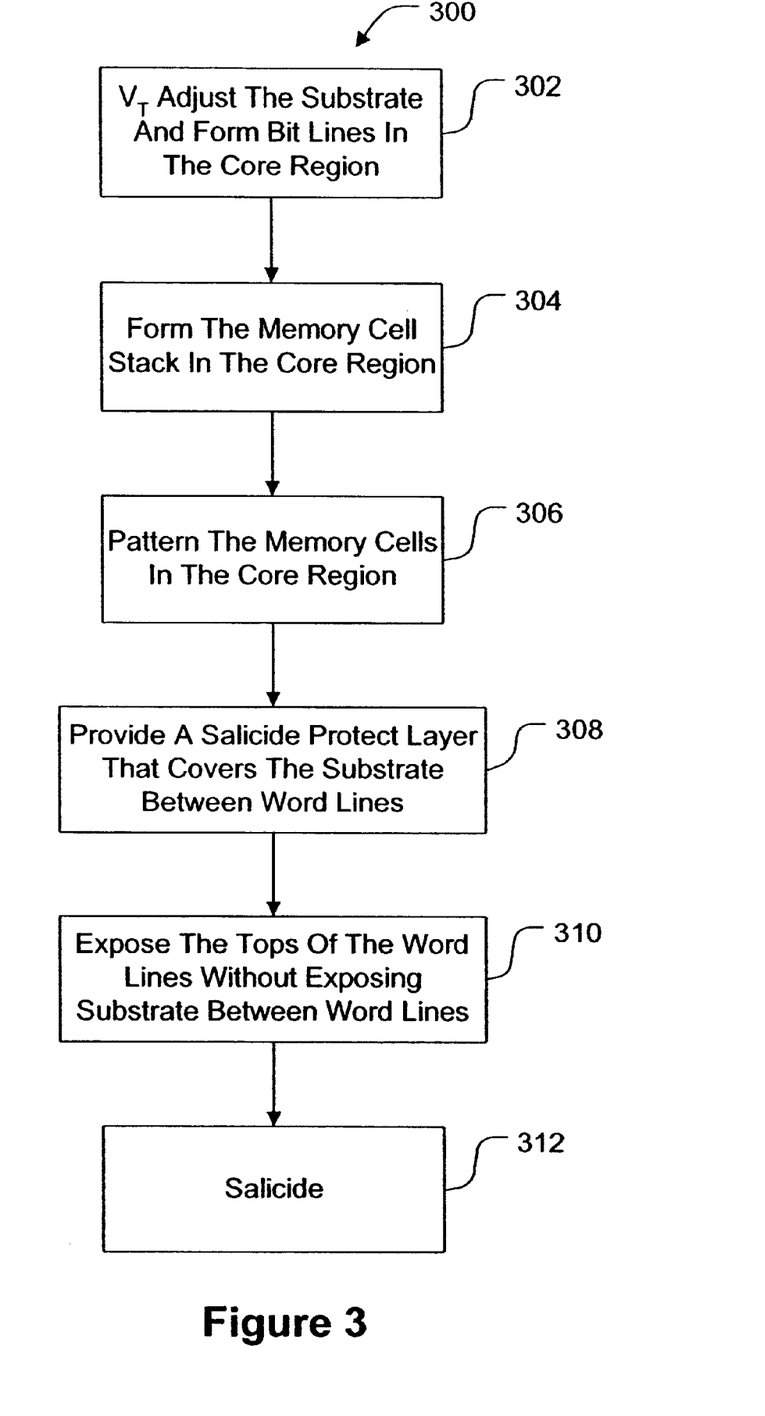
FIG. 3 illustrates a method according to another aspect of the present invention.

FIG. 3 provides a flow chart showing certain actions in a process 300 in accordance with another aspect of the invention. Process 300 can be employed in producing memory device 10 of FIGS. 1 and 2. Act 302 is setting the threshold voltage, $V_T$, for the substrate and forming buried bit lines. The substrate is generally doped p-type while the bit lines are generally doped n-type. Where the memory cell stack includes a multilayer charge trapping dielectric, these doping steps can take place after the multilayer charge trapping dielectric is formed. The substrate doping can be carried out with a blanket doping, whereas the bit line doping generally involves doping through a lithographically patterned resist mask.

Figure 4:
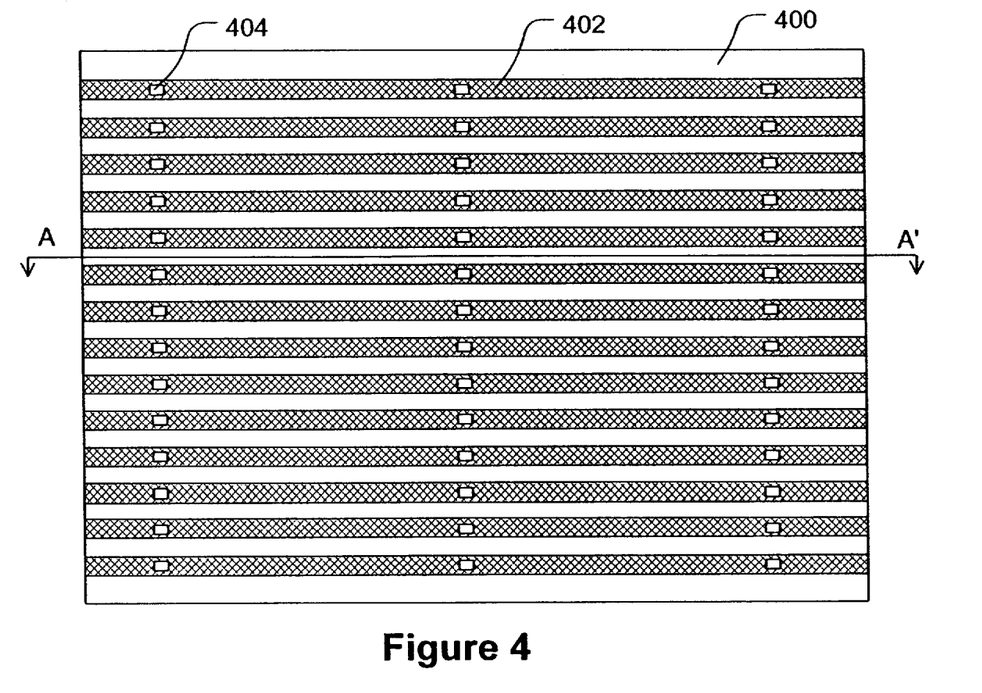
FIG. 4 illustrates a portion of the core region of a partially formed memory device according to a further aspect of the present invention.

FIG. 4 illustrates a semiconductor substrate 400 with buried bit lines 402, such as could be produced by act 302. Word lines are to be formed over the substrate and perpendicular to bit lines 402. The spacing between word lines is generally fixed, although broader spacings are provided between some of the word lines to accommodate bit lines contacts at locations 404.

Act 304 is forming the memory cell stack in at least the core region. The memory cell stack can be either a SONOS type memory cell stack or a floating gate memory cell stack. Peripheral region gate stacks can be formed at the same time as the core memory cell stack, with portions of the core memory cell stack extending into the peripheral region. For example, it is common for at least an oxide layer and a poly layer to extend into the periphery.

Act 306 is patterning the poly layer in at least the core region to form word lines. The entire memory cell stack can be patterned at this time, whereby the substrate between word lines is exposed. Optionally, however, one or more layers of the memory cell stack can be left in between word lines. Gates of the peripheral region can also be patterned at this time.

During the process of patterning the core memory cells, at a point where a dielectric layer is being removed, a mask can be provided to cover at least a portion of the substrate between word lines. In particular, such a mask generally covers at least the substrate between word lines that are broadly spaced to provide locations for bit line contacts. Thereby, a dielectric layer of the memory cell stack can later provide salicide protection for the substrate between word lines.

Providing a mask over at least a portion of the substrate between word lines at a stage of the gate patterning process is an example of a method that can individually, or together with one or more other steps, form act 308, which is providing a salicide protect layer that protects the substrate between word lines. A salicide protect layer is a layer of any material that can prevent the underlying substrate from becoming salicided. A salicide protect layer can include a spacer material and/or one or more other materials. The spacer material can be deposited over the substrate as part of a process of forming source and drain regions adjacent gates in the peripheral region. Optionally, a mask is provided to limit the etching of spacer material, particularly in the space between broadly spaced word lines. Another option is to deposit extra spacer material, which can facilitate leaving spacer material in the spaces between word lines after a spacer etch. A further option is to deposit a layer of dielectric or similar material solely to provide, or facilitate providing, a salicide protect layer.

In act 310, the tops of word lines are exposed without exposing the substrate between word lines. Where a suitable conformation of dielectric layers has been provided, this can be accomplished with an ordinary etching process, either isotropic or anisotropic. Another option that can be used singularly or in combination with one or more etching processes is to remove at least a portion of a dielectric layer with a polishing process.

Act 310 is saliciding. A saliciding metal is deposited over the substrate by any suitable process. Rapid thermal annealing (RTA) is carried out under conditions wherein the saliciding metal reacts with silicon to form a metal silicide. Additional RTA can be employed to obtain the silicide in a desired phase. During the saliciding process, the salicide protect layer prevents the substrate between word lines form becoming salicided. Therefore, essentially no silicide forms on the substrate between word lines.

Figure 5:
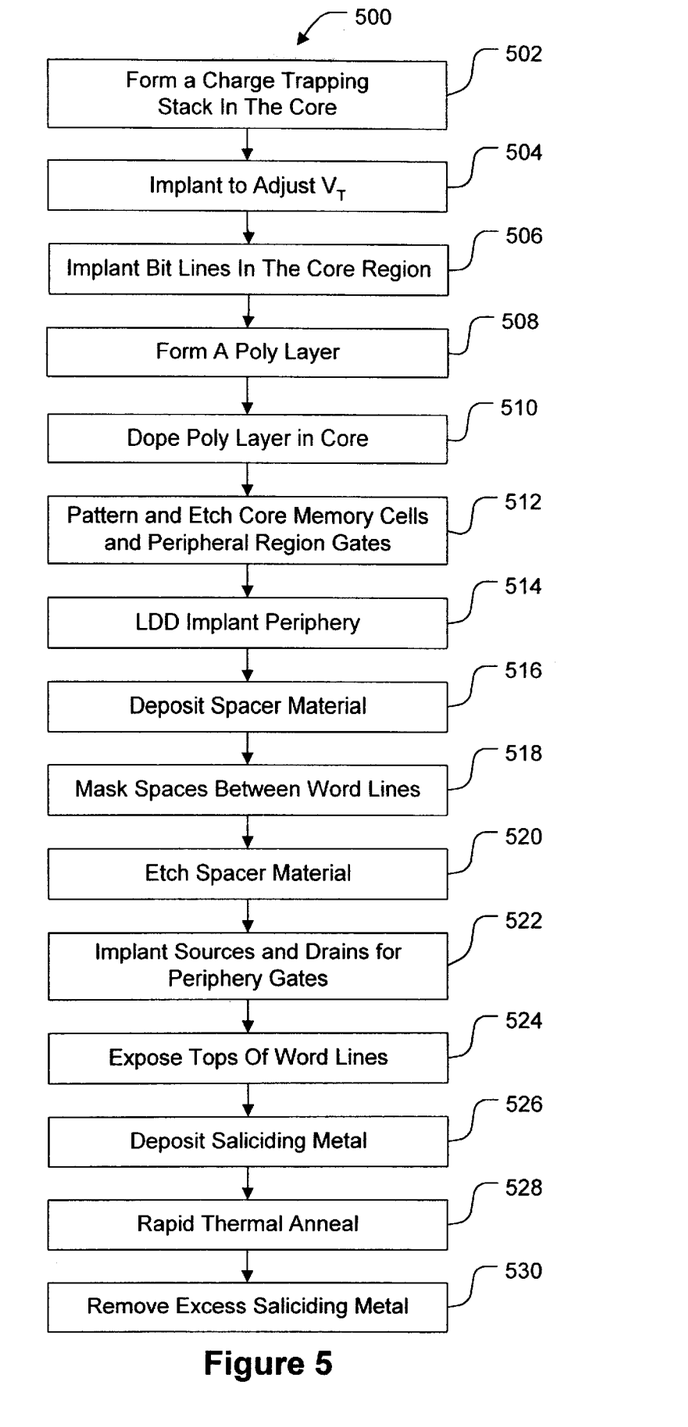
FIG. 5 illustrates a method according to a still further aspect of the present invention.

FIG. 5 provides a flow chart of a more detailed example of a process 500 according to yet another aspect of the present invention. The sequence begins with act 502, forming a charge trapping dielectric stack over the core region of a substrate that includes a semiconductor. The semiconductor is generally silicon, but can be any suitable semiconductor, GaAs or InP for example.

Figure 6:
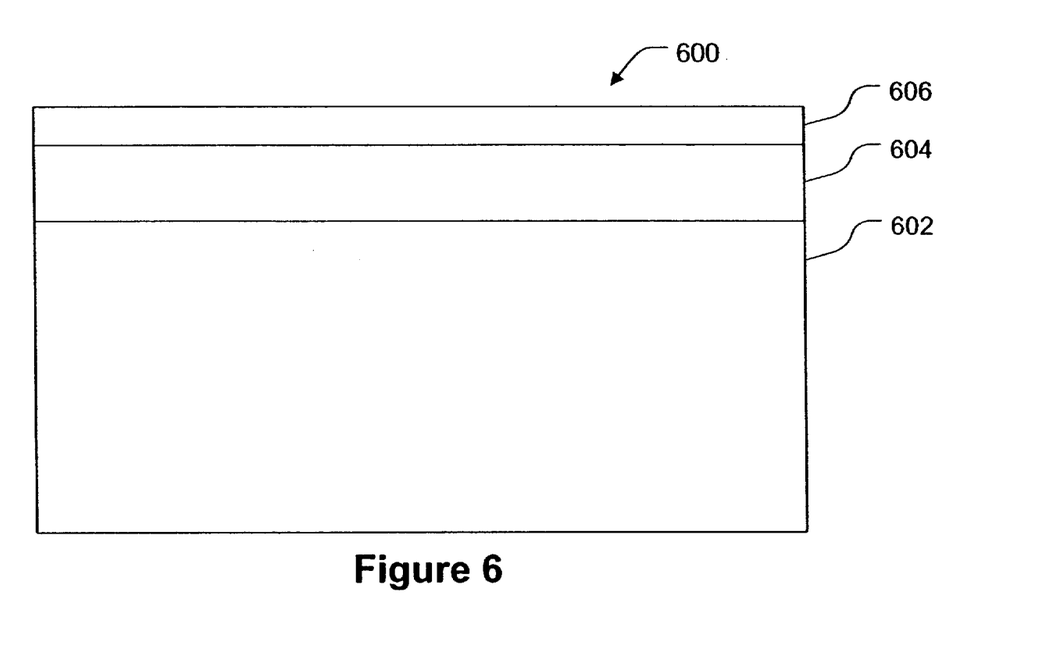
FIG. 6 illustrates the memory stack of a SONOS memory device.

The charge trapping dielectric stack can be the charge trapping portion of a SONOS memory cell stack. FIG. 6 provides an example of a SONOS memory cell stack 600. SONOS memory cell stack 600 include a charge trapping dielectric 604 and a poly layer 606 formed over substrate 602. The charge trapping dielectric can be any dielectric layer or layers that are capable of or facilitate electron trapping. In other words, to facilitate electron trapping, the charge trapping dielectric has a layer with a lower barrier height than the layers sandwiching it (two layers with relatively higher barrier heights sandwiching a layer with a relatively lower barrier height). In the case of an ONO trilayer dielectric, the oxide layers have a barrier height of about 3.1 eV whereas the nitride layer has a barrier height of about 2.1 eV. In this connection, a well is created in the middle layer.

For example, charge trapping dielectrics include an ONO trilayer dielectric, an oxide/nitride bilayer dielectric, a nitride/oxide bilayer dielectric, an oxide/tantalum oxide bilayer dielectric ($SiO_2/Ta_2O_5$), an oxide/tantalum oxide/oxide trilayer dielectric ($SiO_2/Ta_2O_5/SiO_2$), an oxide/strontium titanate bilayer dielectric ($SiO_2/SrTiO_3$), an oxide/barium strontium titanate bilayer dielectric ($SiO_2/BaSrTiO_2$), an oxide/strontium titanate/oxide trilayer dielectric ($SiO_2/SrTiO_3/SiO_2$), an oxide/strontium titanate/barium strontium titanate trilayer dielectric ($SiO_2/SrTiO_3/BaSrTiO_2$), and the like (in each case, the first layer mentioned is the bottom layer while the last layer mentioned is the top layer). Although the term SONOS is suggestive of an ONO layer, as used herein the term encompasses nonvolatile memory devices containing any of the charge trapping dielectrics described above. In other words, a SONOS type nonvolatile memory device contains any dielectric layer or layers that are capable of or facilitate electron trapping, and does not require an ONO charge trapping dielectric.

Where the charge trapping dielectric is an ONO dielectric, one or both of the silicon dioxide layers can be a silicon-rich silicon dioxide layer. One or both of the silicon dioxide layers can also be an oxygen-rich silicon dioxide layer. One or both of the silicon dioxide layers can be a thermally grown or a deposited oxide. One or both of the silicon dioxide layers can be nitrided oxide layers.

A nitride layer can be a silicon-rich silicon nitride layer. The nitride can also be a nitrogen-rich silicon nitride layer. In one aspect of the invention, the charge trapping dielectric has a thickness from about 75 Å to about 300 Å. In another aspect of the invention, the charge trapping dielectric has a thickness from about 100 Å to about 275 Å. In a further aspect of the invention, the charge trapping dielectric has a thickness from about 110 Å to about 250 Å.

In one aspect of the invention, the oxide layers individually have thicknesses from about 50 Å to about 150 Å while the nitride layer has a thickness from about 20 Å to about 80 Å. In another aspect of the invention, the oxide layers individually have thicknesses from about 60 Å to about 140 Å while the nitride layer has a thickness from about 25 Å to about 75 Å. In a further aspect of the invention, the oxide layers individually have thicknesses from about 70 Å to about 130 Å while the nitride layer has a thickness from about 30 Å to about 70 Å.

While process 500 is primarily concerned with forming a SONOS type memory device, the invention can also be employed to form floating gate memory devices. If a floating gate memory device is to be formed, act 502, which involves forming the charge trapping layers of the memory cell stack, is postponed until after the threshold voltage for the substrate is set and buried bit lines are formed.

Figure 7:
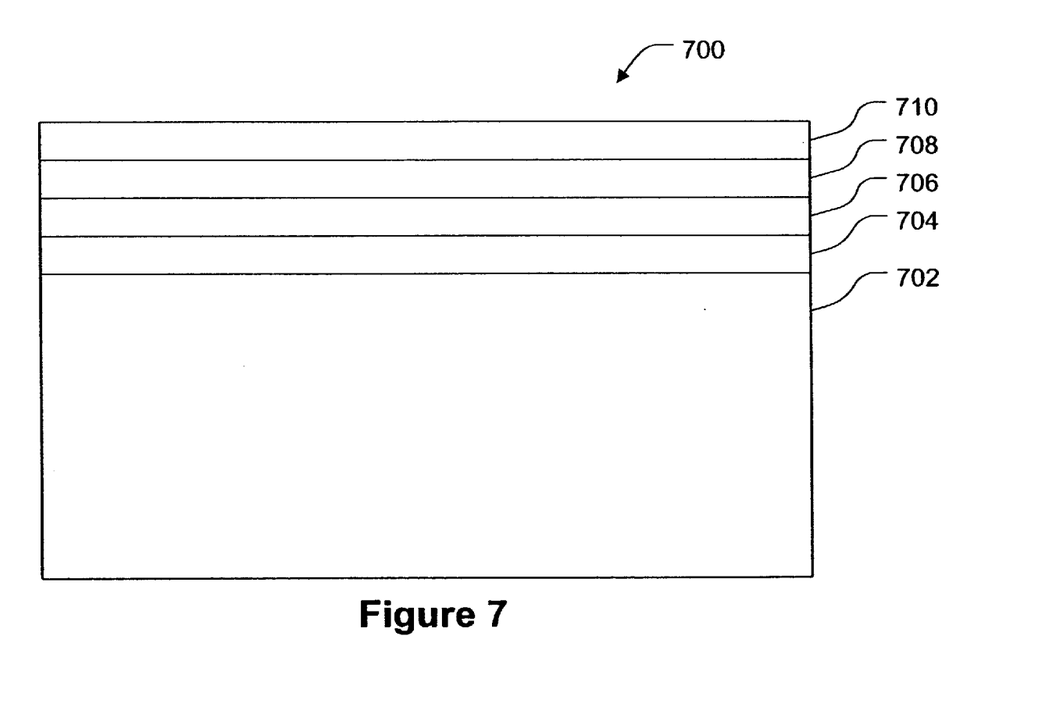
FIG. 7 illustrates the memory stack of a conventional floating gate memory device.

FIG. 7 provides an example of a stack 700 for floating gate memory cells. Gate oxide layer 704 is formed over semiconductor substrate 702. In one aspect of the invention, gate oxide layer 704 is about 30 Å to about 150 Å thick. In another aspect of the invention, gate oxide layer 704 is about 50 Å to about 150 Å thick.

Gate oxides can be formed by any suitable processes including chemical vapor deposition (CVD), dry oxidation, wet oxidation, or thermal oxidation. For example, the gate oxide layer 704 can be formed by dry oxidation at a temperature of about 1050° C., under an atmosphere containing 1.33 liters oxygen. 70 cc HCl and 12.6 liters argon.

Floating gate layer 706 is formed over gate oxide layer 704. Floating gate layer 706 generally contains polysilicon or amorphous silicon. Floating gate layer 706 can be formed in any suitable manner. For example, a phosphorus doped amorphous silicon layer can be deposited via CVD at 530° C., 400 mTorr, with 2000 sccm $SiH_4$, 22 sccm helium, and 1% by weight $PH_3$. In one aspect of the invention, floating gate layer 706 has a thickness of about 400 Å to about 1,200 Å. In another aspect of the invention, floating gate layer 706 has a thickness of about 500 Å to about 1,000 Å. In a further aspect of the invention, floating gate layer 706 has a thickness of about 700 Å to about 900 Å.

A dielectric layer 708 is formed over floating gate layer 706. Most commonly, this dielectric layer is a multilayer dielectric such as an oxide/nitride/oxide ("ONO") layer. The thickness is typically about 120 Å to about 400 Å. Generally speaking, an ONO layer is formed by successive formation of oxide, nitride and oxide layers. The ONO layers can have any suitable thicknesses. The first or bottom oxide layer can be, for example, from about 40 Å to about 60 Å thick. The nitride layer can be, for example, about 60 Å to about 100 Å thick, or from about 70 Å to about 90 Å thick. The top oxide layer can be, for example, from about 20 Å to about 80 Å thick, or about 40 Å to about 60 Å thick. One or more of the oxide layers can also form part of a peripheral region gate oxide.

Dielectric layer 708 can be formed by any suitable means. For example, to form an ONO layer, a bottom oxide layer can be formed using a CVD technique or grown using an oxidation technique. For example, a bottom oxide layer can be formed at a temperature of about 750° C. and a pressure of 600 mTorr with a gas containing 20 sccm $SiH_4$, 1200 sccm $N_2O$, and a carrier gas. An oxide layer can also be formed by depositing then oxidizing TEOS. A nitride layer can also be deposited using CVD techniques. For example, nitride is deposited at a temperature of about 760° C. and a pressure of 330 mTorr with a gas containing 600 sccm $NH_3$ and 100 sccm $SiH_2Cl_2$. The second or top oxide layer can be formed in a manner similar to or different from that employed in forming the first oxide layer. A poly layer 710 covers the charge trapping layers.

Peripheral region gate stacks are commonly formed, at least in part, at the same time as the core memory cell stack. Two oxide thicknesses are often employed in the periphery, one for low voltage gates and another for high voltage gates. The gate oxide layers in the periphery are typically thicker than in the core. For example, a gate oxide in the peripheral region can be about 130 Å to about 400 Å thick. Core and peripheral region gate oxides can be grown at the same time or at different times.

Additional oxidation steps are employed in the peripheral regions where greater thickness of gate oxide is required.

After the charge trapping layers are formed, the substrate is doped to set the threshold voltage ($V_T$) in act 504. However, in some instances, it is possible to optionally perform act 504 before act 502. The substrate can be doped lightly (n– or p–) or heavily (n+ or p+). Examples of suitable dopants include one or more of arsenic, boron, and phosphorus. The doping can involve several layers or wells. Generally, the uppermost well is made p-type. As a specific example, boron can be implanted to a dosage of about $1\times10^{11}$ atoms per cm$^2$ to about $1\times10^{13}$ atoms per cm$^2$. The implant can be carried out with an energy of about 80 kev to about 300 keV.

Act 506 is forming buried bit lines. Buried bit lines are formed by doping the substrate. Suitable dopants again include one or more of arsenic, boron, BF$_2^+$, antimony, indium, and phosphorus, although the dopant used to form the buried bit lines is of opposite type from that used to set the threshold voltage for the substrate. In one embodiment, the bit lines are implanted to a dosage from about $1\times10^{14}$ to about $1\times10^{16}$ atoms/cm$^2$. In another embodiment, the bit lines are implanted to a dosage from about $5\times10^{14}$ to about $7\times10^{15}$ atoms/cm$^2$. In yet another embodiment, the bit lines are implanted to a dosage from about $1\times10^{15}$ to about $5\times10^{15}$ atoms/cm$^2$. Optionally, the bit lines can be implanted prior to setting the threshold voltage for the substrate.

Act 508 is forming a poly layer over at least the core region. The poly layer contains amorphous silicon or polysilicon. In one aspect of the invention, the poly layer has a thickness of about 500 Å to about 6000 Å. In another aspect of the invention, the poly layer has a thickness of about 750 Å to about 3000 Å. In a further aspect of the invention, the poly layer has a thickness of about 1,000 Å to about 1,500 Å. The poly layer can be formed by any suitable means, including the type of means used to form the floating gate layer of a floating gate memory cell stack. The poly layer generally extends over the peripheral region. Any core region memory cell stack layers that are not wanted in the peripheral region can be selectively formed in the core region or selectively etched from the peripheral region with one or more lithographic masks.

Act 510 is doping the poly layer in at least the core region. Any suitable dopant can be used, arsenic for example. In one aspect of the invention, the poly layer is doped with about $1\times10^{11}$ to about $1\times10^{16}$ atoms/cm$^2$. In another aspect of the invention, the poly layer is doped with about $1\times10^{13}$ to about $5\times10^{15}$ atoms/cm$^2$. In a further aspect of the invention, the poly layer is doped with about $3\times10^{14}$ to about $3\times10^{15}$ atoms/cm$^2$. Optionally, the peripheral region is masked while the poly layer is being doped in the core region.

In some instances, act 508 and act 510 can be performed simultaneously. In these instances, in situ doping formation techniques may be employed.

Act 512, which takes place after doping the poly layer in the core region, is patterning the core memory cells and peripheral region gates. Patterning can be carried out with any suitable method, including, for example, a lithographic process. Patterning the core memory cells involves patterning at least the poly layer. The patterning divides the poly layer of the core region into spaced apart word lines. In one aspect of the invention, patterning provides a spacing between word lines, except where contacts are placed, from about 0.05 μm to about 1.5 μm. In another aspect of the invention, the spacing between word lines is from about 0.1 μm to about 1 μm. In a further aspect of the invention, the spacing between word lines is from about 0. 15 μm to about 0.75 μm. The widths of the word lines are comparable to the spaces between word lines.

The word line spacing is increased where bit line contacts are to be provided. In one aspect of the invention, the spacing is increased by a factor of about 1.5 to about 4. In a further aspect of the invention, the spacing is increased by a factor of about 2 to about 3.

Acts 514, 516, 520, and 522 provide source and drain regions adjacent gates in the peripheral region. During these optional steps, n-type and p-type transistors are masked and implanted separately. The core is generally masked at least during acts 514 and 522, which involve doping. Optional act 514 is an optional self aligned LDD implant. This implant provides a dosage of about $1\times10^{11}$ atoms/cm$^2$ to about $1\times10^{13}$ atoms/cm$^2$ at an energy of about 20 keV to about 80 keV. Suitable dopants can include, for example, arsenic, boron, or phosphorus. Act 514 is optional to the extent that an LDD doping for peripheral region gates can be provided when the poly layer is doped in act 510 (acts 510 and 514 performed simultaneously).

Optional act 516 is depositing a spacer material. Any suitable material can be used, including a nitride and/or an oxide, for example. An oxide layer can be formed by depositing then oxidizing TEOS. Using CVD techniques, a nitride layer can also be deposited. Any masks are normally removed prior to depositing the spacer material, whereby the spacer material generally deposits directly over and between the word lines of the core region.

Optional act 518 is providing a mask to protect the substrate between word lines during spacer etching, at least between word lines where the substrate would otherwise be exposed due to broad word line spacing that provides for bit line contacts. A mask can alternatively be provided for any of the dielectric etching processes, including one or more etching processes employed to pattern the memory cells in the core region. The mask preserves spacer material, or other dielectric material, over the substrate between word lines, whereby some dielectric remains after etching and protects the substrate against saliciding. The mask need not be provided throughout an etching process, or through every etching process. For example, if a mask used in a first dielectric etching process has left a comparatively thick dielectric layer over the substrate between word lines, a subsequent etching process can expose the substrate adjacent gates in the peripheral region without exposing the substrate between word lines in the core region.

Optional act 520 is etching and can be carried out with any suitable process. Etching leaves a layer of spacer material to the sides of the peripheral region gates while exposing the source and drain regions for the peripheral gates. The etching process is usually an anisotropic etching process, such as reactive ion etching. Choice of a suitable process and reagents depends on the spacer material. Reactive ion etching can be carried out with CF$_4$, for example. Wet etching can be carried out with an acid, a base, or a solvent. Acids that can be employed include hydrofluoric acid, hydrobromic acid, nitric acid, phosphoric acid or acetic acid. Bases that can be employed include hydroxides such as sodium hydroxide, ammonium hydroxide, and potassium hydroxide. Solvents can be polar, such as water, or non-polar, such as xylene or cellusolve, or of intermediate polarity, such as alcohols including methanol. Act 522 is doping to provide source and drain regions adjacent gates in the periphery. The spacers limit the concentration of dopant immediately adjacent the gates. N-type and p-type gates are doped separately. In one aspect of the invention, the dopants are implanted to a dosage from about $1 \times 10^{14}$ to about $1 \times 10^{16}$ atoms/cm$^2$. In another aspect of the invention, the dopants are implanted to a dosage from about $5 \times 10^{14}$ to about $7 \times 10^{15}$ atoms/cm$^2$. In a further aspect of the invention, the dopants are implanted to a dosage from about $1 \times 10^{15}$ to about $5 \times 10^{15}$ atoms/cm$^2$.

Act 524, which is carried out prior to saliciding, is removing any material on the tops of the word lines, particularly spacer material, while leaving a protective layer over the substrate between word lines in the core region. Optionally, the periphery is also masked. A spacer or dielectric material over the word lines can be removed by chemical, mechanical, or combined chemical and mechanical means. Chemical removal includes wet etching. Additional examples of chemical removal include plasma and reactive ion etching. The plasma can be of oxygen, fluorine, chlorine, hydrogen, or a combination of these, optionally with other gases. Reactive ion etching can be done with oxygen, for example. Combined chemical and mechanical means include chemical mechanical polishing (CMP). CMP uses a material, often referred to as a slurry, that does not rapidly dissolve the layer being removed, but modifies its chemical bonding sufficiently to facilitate mechanical removal with a polishing pad. Material can also be removed by purely mechanical means. A polishing pad attached to a rigid flat surface can be moved against the upper layer to gradually remove an amount of material appropriate to expose the tops of the word lines.

Acts 526, 528, and 530 relate to the saliciding process. This process forms a silicide on exposed silicon, including at least the word lines of the core region.

Generally, the silicide is also formed in the source and drain regions of the periphery.

A silicide is a compound of Si and a metal. Any suitable metal can be employed, including metals of the Group IVA, VA, and VIII. Specific examples include Ti, Ni, or Co, forming compounds such as TiSi$_2$, NiSi, and CoSi$_2$.

In act 526, metal is deposited over the surface. The metal can be deposited by any suitable means, including, for example, evaporation, sputtering, and CVD. In the evaporation method, a metal film is deposited by condensation of a vapor on the substrate, which is maintained at a lower temperature than the vapor. The metal can be vaporized by any suitable method, including, for example, resistive heating, inductive heating, laser bombardment, or laser heating.

In sputter-deposition., the metal to be deposited is bombarded by energetic ions to free some atoms. These atoms are condensed on the substrate to form the film. In CVD, the metal is produced by one or more reactions occurring either in the vapor phase or at the surface of the substrate. The reactions are generally induced by heat, which causes either a decomposition of the metal containing compound or reaction between the different species. Metal organic compounds are useful in CVD processes.

Once the metal is deposited, silicide is formed in act 528 by RTA. RTA is employed because it induces chemical reactions and phase changes while avoiding prolonged heating of the substrate that could cause undo diffusion of the metal or dopants. RTA is generally accomplished with lasers, heat lamps, such as arc or tungsten-halogen lamps, although other suitable apparatus can be employed, including an electrically heated bell jar and in some cases, a furnace. The temperature depends on, among other factors, the type of silicide being formed.

Annealing of titanium silicide often involves two RTA steps. The first RTA is at a temperature from about 500 to about 700° C. and results in the formation of the relatively high resistivity C49 TiSi$_2$ phase. For example, RTA at 650° C. for 30 seconds can be employed. A selective etch can be used to remove un-reacted metal on the sidewall spacer and isolate gates from the source/drain regions. A second RTA at a temperature from about 700 and about 900° C. transforms the relatively high resistivity C49 TiSi$_2$ phase to the relatively low resistivity phase C54 TiSi$_x$. The atmosphere (N$_2$, level of vacuum, etc.) and impurities can affect the competing kinetics and vary the optimum anneal time and temperature.

CoSi$_2$ is also commonly formed with two RTA steps. TiN capping can be employed to prevent oxidation of Co and provide a smooth film. For example, a Co film can be sputter-deposited, followed by TiN film deposition while maintaining a vacuum. After a first RTA, the TiN cap is etched off using ammonium hydroxide solution. The un-reacted Co layer on SiO$_2$, or other spacer material, is selectively etched off using hydrochloric acid solution. A second RTA converts CoSi to CoSi$_2$.

Act 530 removes any un-reacted metal that could form unwanted compounds in later processing steps. Un-reacted metal can be removed by any suitable means. Generally, the metal is removed by washing with an acid solution. For example, a solution of hydrochloric and/or nitric acid can be employed. Although not shown, further processing is performed to complete the fabrication of the flash memory device.

Figure 8:
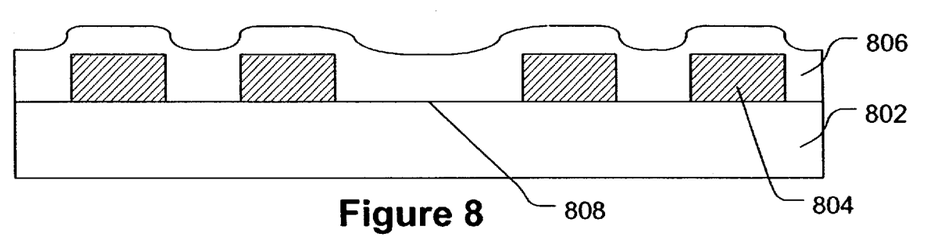
FIG. 8 is an illustration corresponding to a view along a portion of line AA' of FIG. 4 after forming a dielectric layer over the core region.
Figure 9:
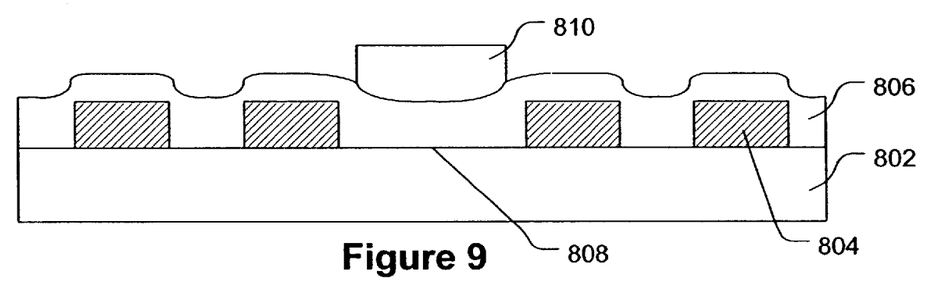
FIG. 9 is an illustration corresponding to FIG. 8 after masking a space between word lines.
Figure 10:
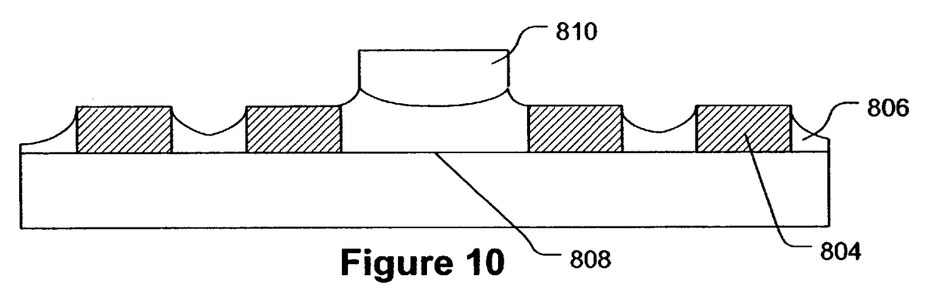
FIG. 10 is an illustration corresponding to FIG. 9 after etching.

FIGS. 8 to 10 schematically illustrate an example of the foregoing process. FIG. 8 illustrates a potion of the core wherein memory cells 804 and a contact location 808 in substrate 804 are coated with a spacer material 806. The view corresponds to a portion of the cross section along line AA' in FIG. 4. FIG. 9 illustrates the formation of a mask 810 over contact location 808. FIG. 10 illustrates the result of an etch carried out with mask 810 in place. The spacer material over contact location 808 is preserved while the tops of memory cells 804 are exposed.

Figure 11:
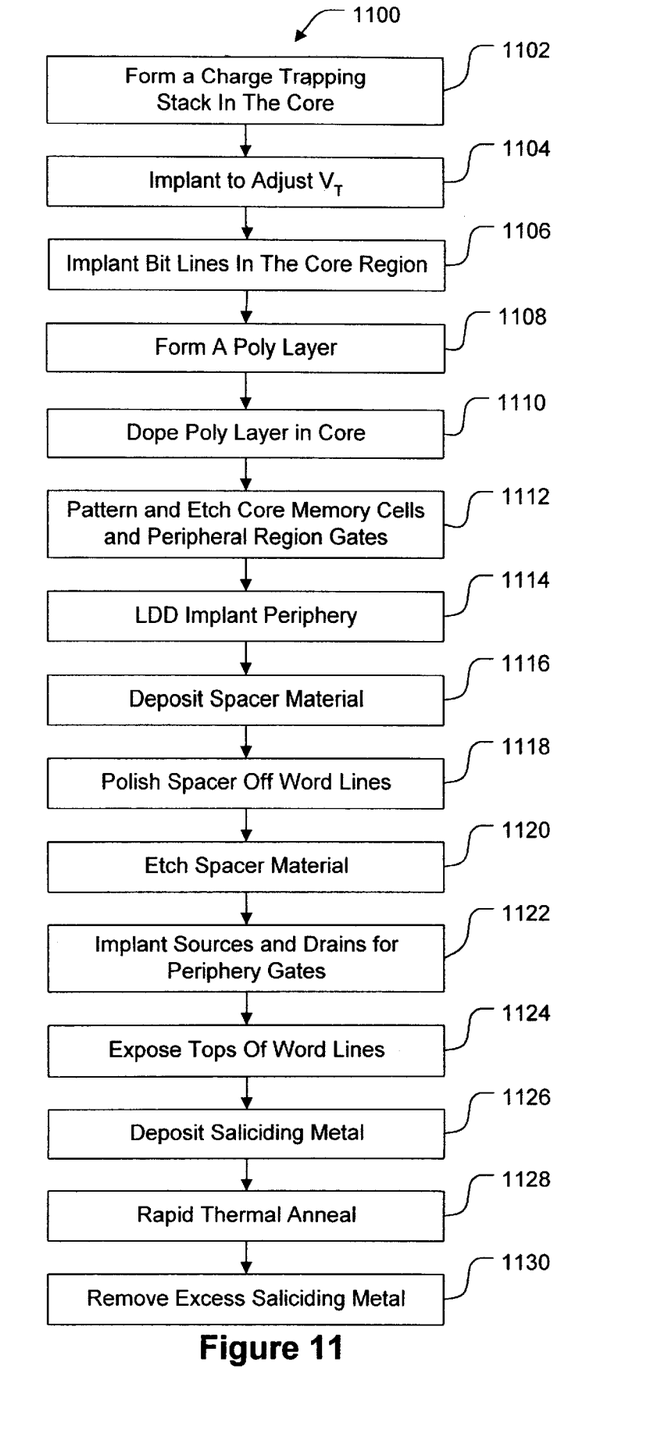
FIG. 11 illustrates a method according to yet another aspect of the present invention.

FIG. 11 is a flow chart of a process 1100 according to another aspect of the present invention. Process 1100 has many steps that are similar to process 500, including, forming a charge trapping stack in the core, implanting to adjust V$_T$, implanting bit lines, forming a poly layer, doping the poly layer, masking and etching the memory cells and the peripheral region gates, LDD implanting the periphery, depositing spacer material, etching the spacer material, forming sources and drains adjacent peripheral region gates, depositing saliciding metal, RTA, and removing excess saliciding metal. Differences lie in acts 1118 and 1120. In act 1118, a dielectric, spacer, or similar material is polished off from the core region. The material can be a spacer material or a material deposited to provide salicide protection for the substrate between word lines. The polishing is usually carried out to expose the tops of the word lines, but the tops of the word lines can also be exposed with a combination of etching and polishing. Optionally, the polishing step can take place after implanting sources and drains in the periphery. Additional salicide protection material can be deposited after implanting the sources and drains. Examples of polishing processes include mechanical polishing and chemical mechanical polishing, which were discussed previously.

Act 1120 is a spacer etch similar to that employed in process 500. In act 1120, the core is optionally masked. The core can be masked throughout the spacer etch if the polishing process exposes the tops of the word lines. Saliciding takes place after the tops of the core memory cells have been exposed.

Figure 12:
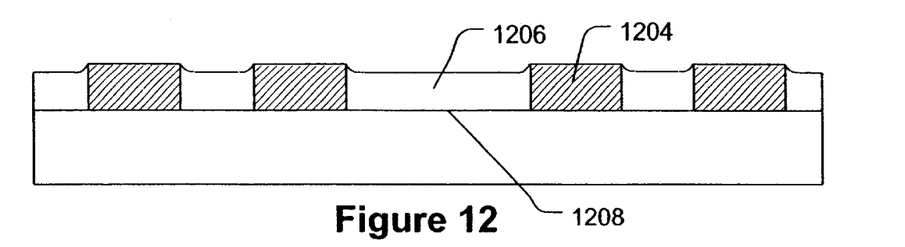
FIG. 12 is an illustration corresponding to a view along a portion of line AA' of FIG. 4 after forming a dielectric layer over the core region and polishing.

FIG. 12 illustrates a potential result of the polishing process. The polishing occurs substantially along a plane, whereby the tops of word lines 1204 are exposed, but dielectric material 1206 substantially fills the areas between word lines 1204 and specifically covers contact location 1208, whereby core word lines 1204 can be salicided without saliciding contact location 1208.

Figure 15:
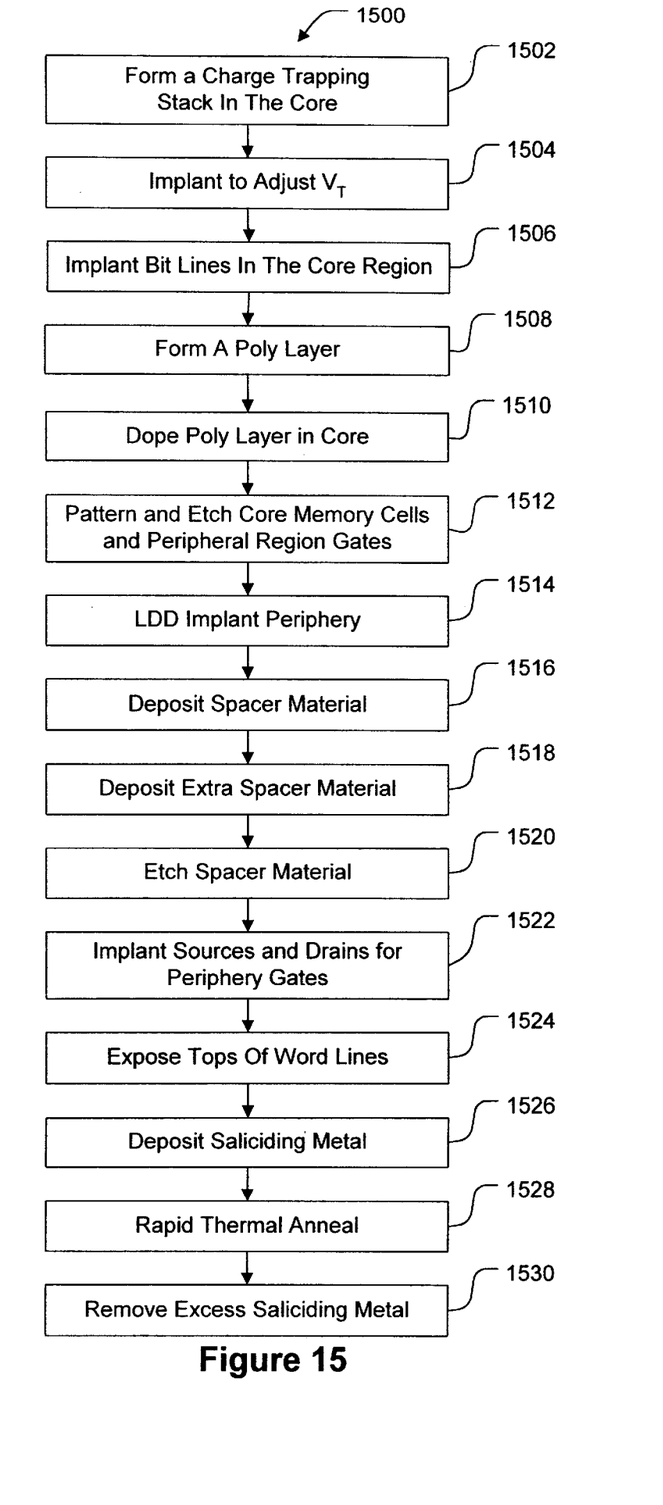
FIG. 15 illustrates a method according to a still further aspect of the present invention.

FIG. 15 is a flow chart of a process 1500 according to yet another aspect of the present invention. Process 1500 has many steps that are similar to process 500, including, forming a charge trapping stack in the core, implanting to adjust $V_T$, implanting bit lines, forming a poly layer, doping the poly layer, masking and etching the memory cells and the peripheral region gates, LDD implanting the periphery, depositing spacer material, forming sources and drains adjacent peripheral region gates, depositing saliciding metal, RTA, and removing excess saliciding metal. Here, differences lie in one or more of acts 1518, 1520 and 1524. In act 1518, extra spacer material, a dielectric, or similar material, is deposited over at least the core. Act 1518 can optionally be postponed until after peripheral region sources and drains are formed in act 1522.

A dielectric or similar material can be an oxide, a nitride, or other material that can be etched without substantially etching polysilicon. In one aspect of the invention, the extra material is deposited to a thickness from about 0.25 to about 5 times that of the memory cell stack. In another aspect of the invention, it is deposited to a thickness from about 0.5 to about 2.5 times that of the memory cell stack. In a further aspect of the invention, it is deposited to a thickness from about 1 to about 1.5 that of the memory cell stack.

The extra material can be etched as part of act 1520, the spacer etch, and/or as part of act 1524, exposing the tops of the word lines. Isotropic and/or anisotropic etches can be employed. Material can also be removed by polishing.

Figure 13:
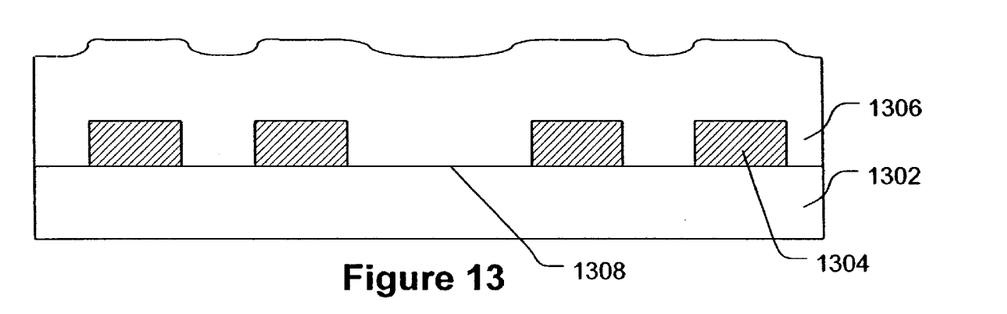
FIG. 13 is an illustration corresponding to a view along a portion of line AA' of FIG. 4 after forming a thick dielectric layer over the core region.
Figure 14:
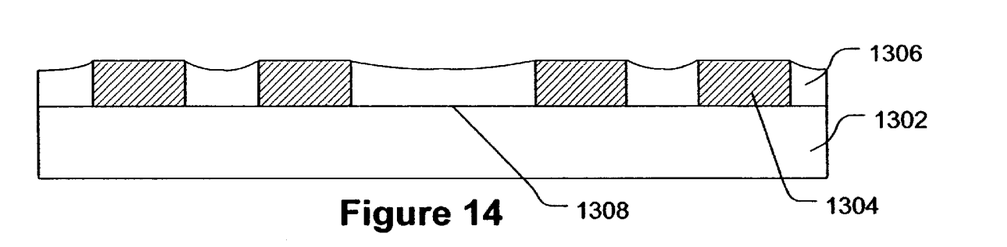
FIG. 14 is an illustration corresponding to FIG. 13 after etching.

FIGS. 13 and 14 illustrate the effect of depositing extra material. FIG. 13 illustrates a thick dielectric layer 1306 covering word lines 1304 and contact location 1308. Dielectric layer 1306 can include a plurality of dielectric layers. The thick layer deposition, and the extended etching process that follows, have the effect of smoothing over topographical features created by the word lines 1304 on substrate 1302. As a result, after etching, as illustrated in FIG. 14, a relatively level dielectric surface is formed and the tops of word lines 1304 can be exposed without exposing contact locations 1308.

Although the invention has been shown and described with respect to a certain preferred embodiment or embodiments, it is obvious that equivalent alterations and modifications will occur to those skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of forming a virtual ground array non-volatile semiconductor memory device, comprising:
   providing a semiconductor substrate, the semiconductor substrate having a core region and a peripheral region;
   forming charge trapping layers comprising at least one dielectric layer over the core region;
   forming a poly layer over at least the charge trapping layers;
   patterning the poly layer in the core region thereby forming adjacent word lines without bit line contacts therebetween having a first spacing and forming adjacent word lines with bit line contacts therebetween having a second spacing, the second spacing being wider than the first spacing;
   providing one or more salicide protect layers over the core region;
   removing a portion of the one or more salicide protect layers to expose the word lines, without exposing the substrate in the spaces between word lines; and
   saliciding the word lines.

2. The method of claim 1, wherein the locations for bit line contacts are masked during at least a portion of the process of removing a portion of the one or more salicide protect layers.

3. The method of claim 1, wherein the one or more salicide protect layers comprise a material used to form spacers in the peripheral region.

4. The method of claim 1, wherein removing a portion of the one or more salicide protect layers comprises polishing.

5. The method of claim 4, wherein the word lines are exposed by polishing.

6. The method of claim 1, wherein removing a portion of the one or more salicide protect layers comprises etching.

7. The method of claim 1, wherein the charge trapping layers and the poly layer form a memory cell stack in the core region and the one or more salicide protect layers are provided with a thickness greater than or about equal to a thickness of the memory cell stack.

8. The method of claim 7, wherein the process of removing a portion of the one or more salicide protect layers comprises polishing.

9. The method of claim 1, wherein the core region comprises buried bit lines.

10. The method of claim 9, wherein the virtual ground array non-volatile semiconductor memory device has a NOR device structure.

11. The method of claim 1, wherein the virtual ground array non-volatile semiconductor memory device comprises a SONOS memory device.

12. The method of claim 1, further comprising
    masking the core region; and
    while the core region is masked and prior to saliciding the word lines, doping the substrate to form source and drain regions adjacent gates in the peripheral region.

13. The method of claim 12, wherein source and drain regions adjacent gates in the periphery are salicided at the same time as the word lines in the core region.

14. The method of claim 1, wherein the substrate is provided without oxide islands between word lines in the core region and oxide islands are not formed between word lines in the core region.

15. A method of forming a virtual ground array non-volatile semiconductor memory device, comprising:

providing a semiconductor substrate having a core region and a peripheral region;

forming charge trapping layers comprising at least one dielectric layer over the core region;

forming a poly layer over at least the charge trapping layers;

patterning the poly layer in the core region thereby forming adjacent word lines without bit line contacts therebetween having a first spacing and forming adjacent word lines with bit line contacts therebetween having a second spacing, the second spacing being wider than the first spacing; and while at least one of the charge trapping layers covers the bit line contacts, saliciding the word lines.

16. The method of claim 15, wherein the substrate is provided without oxide islands between word lines in the core region and oxide islands are not formed between word lines in the core region.

17. The method of claim 15, further comprising providing a salicide protect layer over the core region after patterning the poly layer in the core region.

18. The method of claim 15, wherein all of the charge trapping layers cover the bit line contacts while the word lines are salicided.

19. The method of claim 15, wherein the locations for bit line contacts are masked while one or more of the charge trapping layers are removed.

20. The method of claim 15, wherein the virtual ground array non-volatile semiconductor memory device has a NOR device structure.

21. The method of claim 15, wherein the virtual ground array non-volatile semiconductor memory device comprises a SONOS memory device.

22. The method of claim 15, further comprising masking the core region; and while the core region is masked and prior to saliciding the word lines, doping the substrate to form source and drain regions of gates in the peripheral region.

23. The method of claim 22, wherein source and drain regions adjacent gates in the periphery are salicided at the same time as the word lines in the core region.

24. A method of forming a virtual ground array non-volatile semiconductor memory device, comprising:

providing a semiconductor substrate, the semiconductor substrate having a core region and a peripheral region;

forming charge trapping ONO dielectric over the core region;

forming a poly layer over at least the charge trapping ONO dielectric;

patterning the poly layer in the core region thereby forming adjacent word lines without bit line contacts therebetween having a first spacing and forming adjacent word lines with bit line contacts therebetween having a second spacing, the second spacing being wider than the first spacing;

providing one or more salicide protect layers over the core region;

removing a portion of the one or more salicide protect layers to expose the word lines, without exposing the substrate in the spaces between word lines; and saliciding the word lines.

25. The method of claim 24, wherein the locations for bit line contacts are masked during at least a portion of the process of removing a portion of the one or more salicide protect layers.

26. The method of claim 24, wherein the word lines are exposed by polishing.

27. The method of claim 24, wherein removing a portion of the one or more salicide protect layers comprises etching.

28. The method of claim 24, wherein the core region comprises buried bit lines.

29. The method of claim 24, further comprising masking the core region; and while the core region is masked and prior to saliciding the word lines, doping the substrate to form source and drain regions adjacent gates in the peripheral region.

30. The method of claim 24, wherein the substrate is provided without oxide islands between word lines in the core region and oxide islands are not formed between word lines in the core region.

* * * * *